United States Patent
Kato et al.

(10) Patent No.: US 9,780,037 B2
(45) Date of Patent: Oct. 3, 2017

(54) METHOD OF PROCESSING TARGET OBJECT

(71) Applicant: Tokyo Electron Limited, Tokyo (JP)

(72) Inventors: Kazuya Kato, Miyagi (JP); Toshihiko Shindo, Miyagi (JP); Ryuichi Asako, Yamanashi (JP); Hiroshi Nagahata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/264,737

(22) Filed: Sep. 14, 2016

(65) Prior Publication Data
US 2017/0084542 A1 Mar. 23, 2017

(30) Foreign Application Priority Data

Sep. 18, 2015 (JP) ................................ 2015-185167

(51) Int. Cl.
| | | |
|---|---|---|
| H01L 23/532 | (2006.01) | |
| H01L 21/311 | (2006.01) | |
| H01L 21/768 | (2006.01) | |
| H01L 21/02 | (2006.01) | |

(52) U.S. Cl.
CPC .. *H01L 23/53238* (2013.01); *H01L 21/02118* (2013.01); *H01L 21/31116* (2013.01); *H01L 21/76826* (2013.01); *H01L 21/76834* (2013.01); *H01L 23/5329* (2013.01)

(58) Field of Classification Search
None
See application file for complete search history.

(56) References Cited

U.S. PATENT DOCUMENTS

| | | | | |
|---|---|---|---|---|
| 6,211,092 B1* | 4/2001 | Tang | ................ | H01L 21/76807 257/E21.252 |
| 6,372,636 B1* | 4/2002 | Chooi | .............. | H01L 21/76807 257/E21.579 |
| 6,380,096 B2* | 4/2002 | Hung | ................ | H01L 21/02063 216/39 |
| 6,503,840 B2* | 1/2003 | Catabay | ............ | H01L 21/02063 257/E21.252 |
| 6,693,038 B1* | 2/2004 | Shen | ................ | H01L 21/02063 257/E21.252 |
| 6,784,109 B2* | 8/2004 | Kofuji | ................ | H01J 37/3266 257/E21.226 |
| 6,949,203 B2* | 9/2005 | Hsieh | ................ | H01J 37/32458 216/41 |
| 2007/0254476 A1* | 11/2007 | Chou | .................... | C11D 7/265 438/643 |
| 2012/0064713 A1* | 3/2012 | Russell | ............. | H01L 21/02277 438/653 |

FOREIGN PATENT DOCUMENTS

JP 2006-156486 A 6/2006

* cited by examiner

*Primary Examiner* — Allan Olsen
(74) *Attorney, Agent, or Firm* — Pearne & Gordon LLP

(57) ABSTRACT

A plasma processing method can suppress both surface roughness of a wiring and surface roughness of a metal mask. The method includes generating plasma of a first processing gas containing a fluorocarbon gas and/or a hydrofluorocarbon gas to etch a diffusion barrier film until a copper wiring is exposed and generating plasma of a second processing gas containing a carbon-containing gas to form an organic film on a surface of a target object in which the diffusion barrier film is etched.

13 Claims, 13 Drawing Sheets

METHOD OF PROCESSING TARGET OBJECT

CROSS-REFERENCE TO RELATED APPLICATION

This application claims the benefit of Japanese Patent Application No. 2015-185167 filed on Sep. 18, 2015, the entire disclosures of which are incorporated herein by reference.

TECHNICAL FIELD

The embodiments described herein pertain generally to a method of processing a target object; and, more particularly, to a method including a process performed on the target object before the target object is transferred into an atmospheric environment in the manufacture of a multilayer wiring structure.

BACKGROUND

A multilayer wiring structure may be used as a wiring structure of an electronic component. The multilayer wiring structure includes, for example, a first wiring layer, a diffusion barrier film and a second wiring layer. The first wiring layer includes an insulating film and a copper wiring, and the copper wiring is formed within a trench which is formed in the insulating film. The diffusion barrier film is provided on the first wiring layer. The second wiring layer is provided on the diffusion barrier film. The second wiring layer includes an insulating film and a copper wiring. The copper wiring of the second wiring layer is formed within a trench and a via hole which are formed in the insulating film of the second wiring layer. The copper wiring of the second wiring layer is connected to the copper wiring of the first wiring layer through an opening formed in the diffusion barrier film.

A damascene method is used to manufacture this multilayer wiring structure. By way of example, in a dual damascene method, a diffusion barrier film and an insulating film are formed on a first wiring layer of a target object. Then, a resist mask provided with an opening is formed on the insulating film, and a trench and a via hole is then formed in the insulating film by plasma etching. Subsequently, an opening is formed in the diffusion barrier film by plasma etching. This opening is connected to the via hole and extended down to a surface of a copper wiring of the first wiring layer. After the opening is formed in the diffusion barrier film, the target object is transferred into an atmospheric environment. Thereafter, a wet cleaning process is performed on the target object, and copper is filled in the trench, the via hole and the opening of the diffusion barrier film.

In the plasma etching of the diffusion barrier film by using the damascene method, a processing gas containing fluorine is generally used. In the plasma etching with this processing gas, if the opening is formed in the diffusion barrier film and the copper wiring of the first wiring layer is exposed, the surface of the copper wiring is exposed to active species of the fluorine. As a result, copper fluoride is formed on the surface of the copper wiring of the first wiring layer. If the copper fluoride comes into contact with moisture under the atmospheric environment, a hydrate is generated. Accordingly, surface roughness of the copper wiring is generated.

As a technique to deal with the surface roughness of the copper wiring, a technique of reducing the copper fluoride by performing a plasma process with a nitrogen gas and a hydrogen gas before the target object is transferred into the atmospheric environment and after the plasma etching of the diffusion barrier film is conducted is described in Patent Document 1.

Patent Document 1: Japanese Patent Laid-open Publication No. 2006-156486

In this technique, it is required to use a metal mask made of, for example, Ti or TiN instead of the resist mask which is typically used in the manufacture of the multilayer wiring structure. If, however, the plasma process with the nitrogen gas and the hydrogen gas is performed after the plasma etching of the diffusion barrier film is conducted and, then, if the target object is transferred into the atmospheric environment, the metal mask becomes to have surface roughness. This surface roughness of the metal mask is also deemed to be caused by a contact between the target object and moisture in the atmospheric environment. In this regard, it is required to suppress both the surface roughness of the copper wiring and the surface roughness of the metal mask.

SUMMARY

In one exemplary embodiment, a method of processing a target object includes (i) preparing the target object, including a wiring layer having a first insulating film and a copper wiring formed in the first insulating film, a diffusion barrier film provided on the wiring layer, a second insulating film provided on the diffusion barrier film and a metal mask which is provided on the second insulating film and provided with an opening, in which a portion of the second insulating film exposed through the opening is etched; (ii) generating plasma of a first processing gas containing a fluorocarbon gas and/or a hydrofluorocarbon gas to etch the diffusion barrier film until the copper wiring is exposed (hereinafter, referred to as "first process"); and (iii) generating plasma of a second processing gas containing a carbon-containing gas to form an organic film on a surface of the target object in which the diffusion barrier film is etched (hereinafter, referred to as "second process").

In the method according to the exemplary embodiment, the organic film is formed on the surface of the target object in the second process after etching the diffusion barrier film in the first process. The target object is transferred into an atmospheric environment after the second process is performed. At this time, a surface of the copper wiring and a surface of the metal mask are protected from moisture in the atmosphere by the organic film. Therefore, according to this method, both surface roughness of the copper wiring and surface roughness of the metal mask can be suppressed.

The carbon-containing gas may be a hydrocarbon gas. The organic film formed by the hydrocarbon gas hardly contains fluorine. Accordingly, this organic film has a high wetting property, i.e., a small contact angle with respect to a cleaning liquid used in wet cleaning. Therefore, this organic film is easily removed by the wet cleaning.

When the carbon-containing gas is the hydrocarbon gas, a processing gas not containing a hydrogen gas may be used as the second processing gas. The hydrogen gas is a source of active species of hydrogen having an effect of reducing the organic film. Since the second processing gas does not contain the hydrogen gas, the organic film can be formed efficiently.

The carbon-containing gas may be a fluorocarbon gas, and the second processing gas may further contain a hydrogen gas. In this exemplary embodiment, the fluorocarbon gas serves as a carbon source of the organic film, and the hydrogen gas has a function of reducing fluorine in the organic film. Therefore, according to this exemplary embodiment, the organic film having a small amount of fluorine is formed. Since this organic film has the high wetting property, i.e., the small contact angle with respect to the cleaning liquid used in the wet cleaning, the organic film can be easily removed by the wet cleaning.

When the second processing gas contains a fluorocarbon gas and a hydrogen gas, a flow rate of the hydrogen gas may be set to be 5 times to 20 times as large as a flow rate of the fluorocarbon gas contained in the second processing gas. According to the present exemplary embodiment, it is possible to form the organic film having a higher wetting property for the cleaning liquid used in the wet cleaning.

A temperature of the target object may be maintained at 60° C. or less in the second process. In a high temperature environment equal to or higher than, e.g., 300° C., thermal decomposition of the organic film occurs. Since, however, the temperature of the target object in the second process is maintained at 60° C. or less, the organic film can be formed efficiently.

The organic film having a film thickness equal to or larger than 2 nm may be formed in the second process. With the organic film having such a film thickness, it may be possible to suppress the moisture in the atmosphere from being contacted with the organic film.

The fluorocarbon gas contained in the second processing gas may contain one or more of a $C_4F_8$ gas, a $C_4F_6$ gas and a $C_5F_8$ gas. Further, the first processing gas may contain one or more of a $CF_4$ gas, a $CHF_3$ gas, a $C_4F_8$ gas, a $C_4F_6$ gas, a $CH_2F_2$ gas and a $CH_3F$ gas. The diffusion barrier film may include a single-layered film made of SiC, SiCN or SiN, or a multi-layered film including a plurality of films each of which is made of SiC, SiCN or SiN. The second insulating film may include a single-layered film made of SiOCH, a multi-layered film including a film made of $SiO_2$ and a low dielectric constant film, or a multi-layered film including a plurality of low dielectric constant films. The metal mask may be made of Ti or TiN.

The target object may be kept accommodated in a processing vessel of a single plasma processing apparatus over a period during which the first process is performed and a period during which the second process is performed.

According to the exemplary embodiment as described above, both the surface roughness of the copper wiring and the surface roughness of the metal mask can be suppressed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
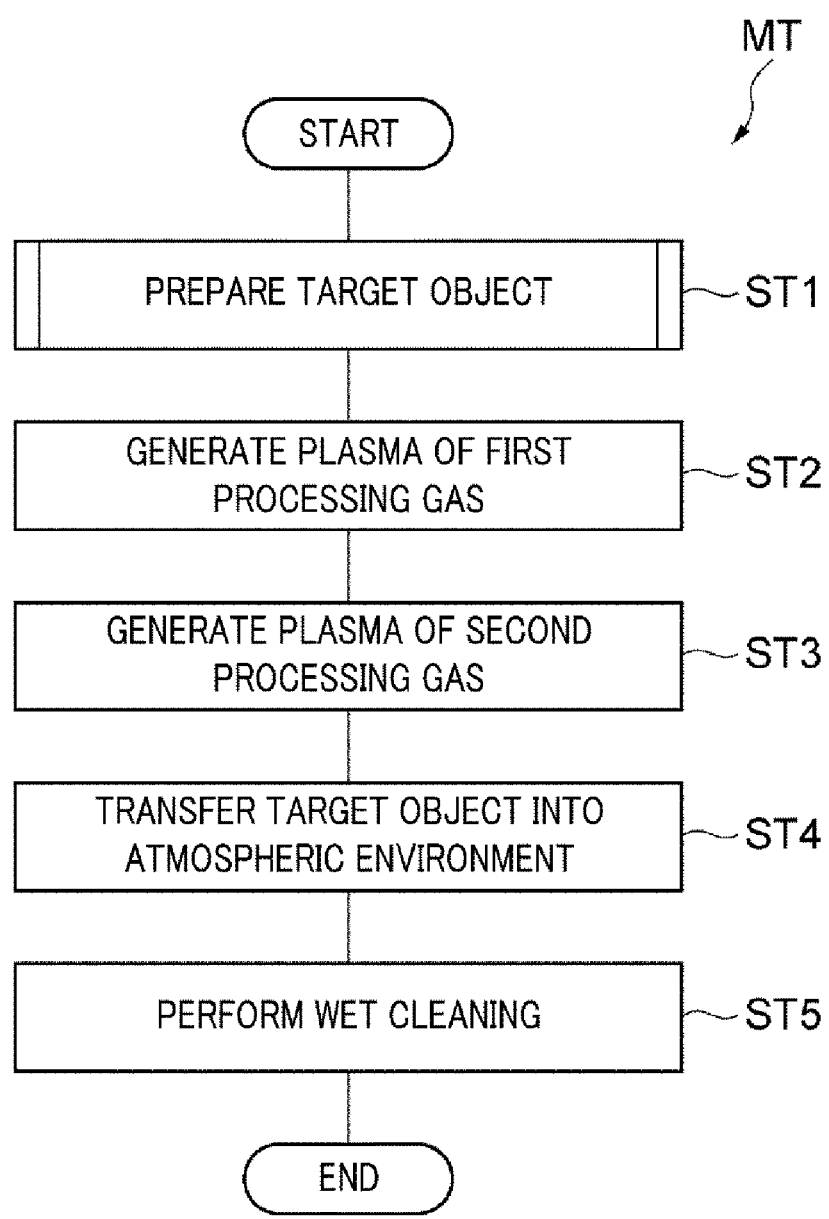
FIG. 1 is a flowchart for describing a method of processing a target object according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a flowchart for describing a method of processing a target object according to an exemplary embodiment. Particularly, the method MT shown in FIG. 1 includes processes which are performed on the target object before the target object is transferred into an atmospheric environment in the manufacture of a multilayer wiring structure.

Figure 2:
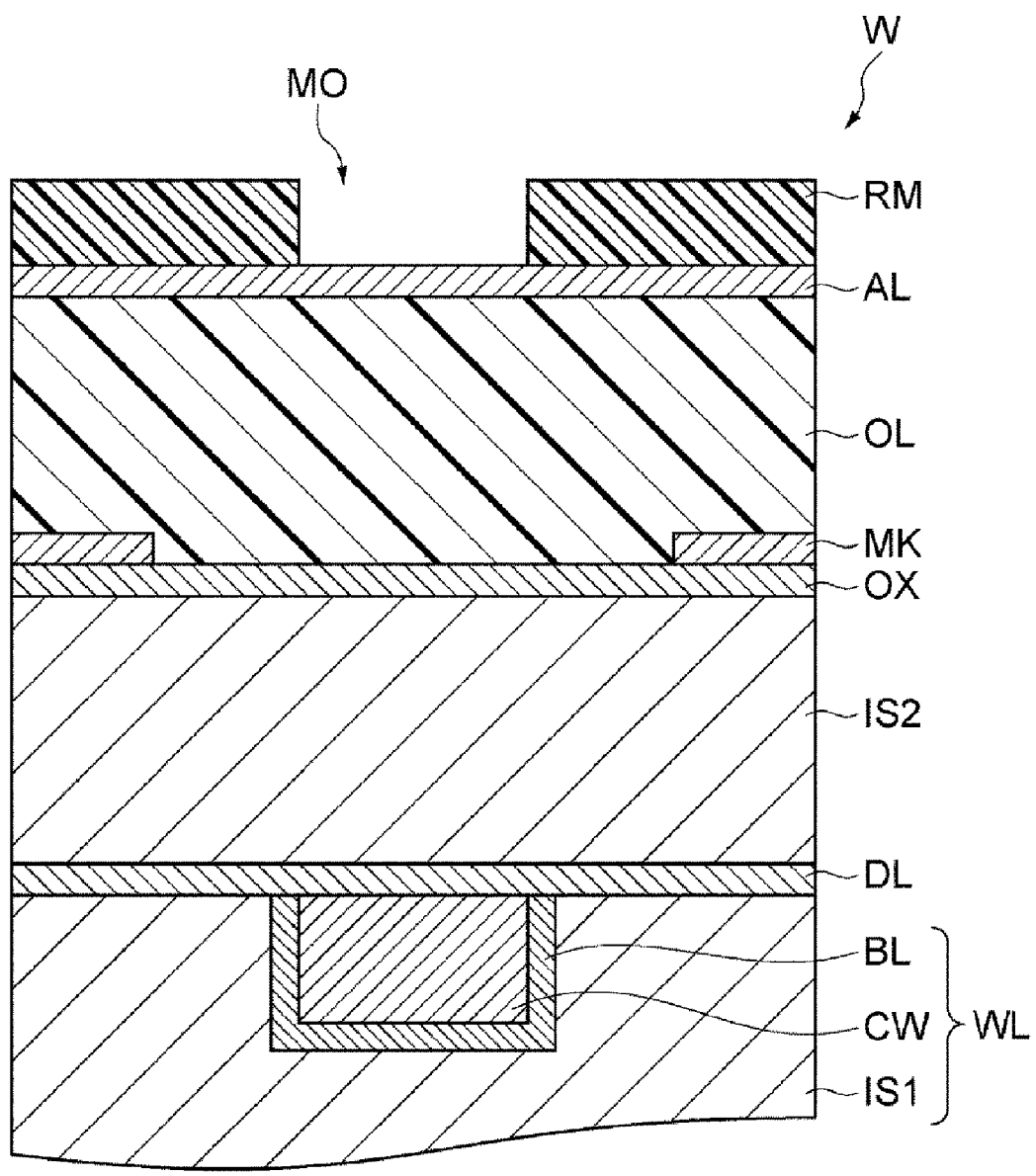
FIG. 2 is a cross sectional view illustrating the target object on which the method of FIG. 1 is performed.

FIG. 2 is a cross sectional view illustrating an example of the target object on which the method of FIG. 1 is performed. The target object (hereinafter, referred to as "wafer W") shown in FIG. 2 is obtained in the course of manufacturing the multilayer wiring structure by using a dual damascene method. The wafer W has a wiring layer WL. The wiring layer WL includes a first insulating film IS1, a barrier metal film BL and a copper wiring CW. Further, the wafer W also includes a diffusion barrier film DL, a second insulating film IS2, an oxide film OX, a metal mask MK, an organic layer OL, an antireflection film AL and a resist mask RM.

The first insulating film IS1 is made of an insulating material and/or a low-dielectric constant material. The first insulating film IS1 may be implemented by, by way of example, but not limitation, a single-layered film made of SiOCH, a multi-layered film including a film made of $SiO_2$ and a low dielectric constant film, or a multi-layered film including a multiple number of low dielectric constant films. The first insulating film IS1 has a trench formed therein. The copper wiring CW is buried in the trench of the first insulating film IS1. The barrier metal film BL is made of a metal such as, but not limited to, Ta, and is provided between a surface of the first insulating film IS1 forming the trench and the copper wiring CW.

The diffusion barrier film DL is provided on the wiring layer WL. The diffusion barrier film DL may be made of, by way of non-limiting example, SiC, SiCN or SiN. Further, the diffusion barrier film DL may be implemented by a multi-layered film having a multiple number of films each of which is made of SiC, SiCN or SiN.

The second insulating film IS2 is provided on the diffusion barrier film DL. The second insulating film IS2 is made of an insulating material and/or a low dielectric constant material. By way of example, the second insulating film IS2 may be implemented by, by way of example, but not limitation, a single-layered film made of SiOCH, a multi-layered film including a film made of $SiO_2$ and a low dielectric constant film, or a multi-layered film including a multiple number of low dielectric constant films.

The oxide film OX is provided on the second insulating film IS2. The oxide film OX may be a silicon oxide film made of, e.g., TEOS. The metal mask MK is provided on the oxide film OX. The metal mask MK has a pattern which is to be transcribed into the second insulating film IS2. That is, the metal mask MK is provided with an opening corresponding to a trench which is to be formed in the second insulating film IS2. The metal mask MK may be made of, e.g., titanium (Ti) or titanium nitride (TiN).

The organic layer OL is formed to cover the metal mask MK and to fill the opening of the metal mask MK. The antireflection film AL is provided on the organic layer OL. The resist mask RM is provided on the antireflection film AL. The resist mask RM has a pattern which is to be transcribed into the second insulating film IS2. That is, the resist mask RM is provided with an opening corresponding to a via hole which is to be formed in the second insulating film IS2.

Figure 3:
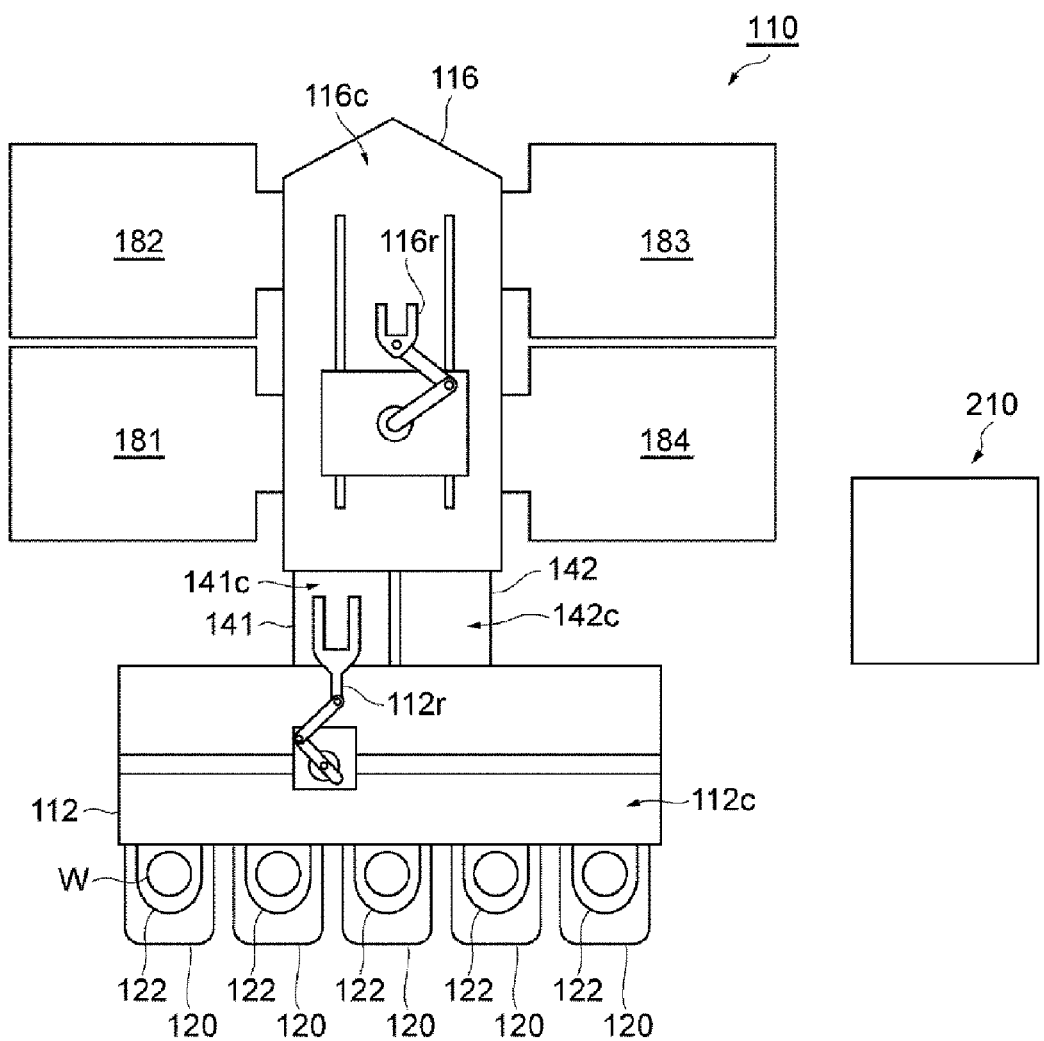
FIG. 3 is a diagram schematically illustrating an example of a substrate processing system and a cleaning apparatus in which the method of FIG. 1 is performed.

FIG. 3 is a diagram schematically illustrating a substrate processing system in which the method of FIG. 1 is performed. The substrate processing system 110 shown in FIG. 3 includes a loader module 112, a load lock module 141, a load lock module 142, a transfer module 116 and a multiple number of process modules 181 to 184.

The loader module 112 is an apparatus configured to transfer a substrate in an atmospheric environment. The loader module 112 is equipped with a plurality of tables 120. FOUP 122 configured to accommodate a multiple number of wafers therein is mounted on each of the tables 120. Within the FOUP 122, the wafers are placed in an atmospheric environment.

The loader module 112 has therein a transfer chamber 112c, and a transfer robot 112r is provided in the transfer chamber 112c. The loader module 112 is connected to the load lock module 141 and the load lock module 142. The transfer robot 112r is configured to transfer the substrate between the FOUP 122 and the load lock module 141 or between the FOUP 122 and the load lock module 142.

The load lock module 141 and the load lock module 142 include a chamber 141c and a chamber 142c for preliminary decompression, respectively. The load lock module 141 and the load lock module 142 are connected to the transfer module 116. The transfer module 116 includes a transfer chamber 116c which can be decompressed, and a transfer robot 116r is provided within the transfer chamber 116c. A multiple number of process modules 181 to 184 are connected to the transfer module 116. The transfer robot 116r of the transfer module is configured to transfer the substrate between any one of the load lock modules 141 and 142 and any one of the multiple number of process modules 181 to 184 and, also, between any two of the multiple number of process modules 181 to 184.

Each of the process modules 181 to 184 is a substrate processing apparatus configured to perform a dedicated process on the substrate. One of the process modules 181 to 184 is implemented by a plasma processing apparatus 10 shown in FIG. 4.

Figure 4:
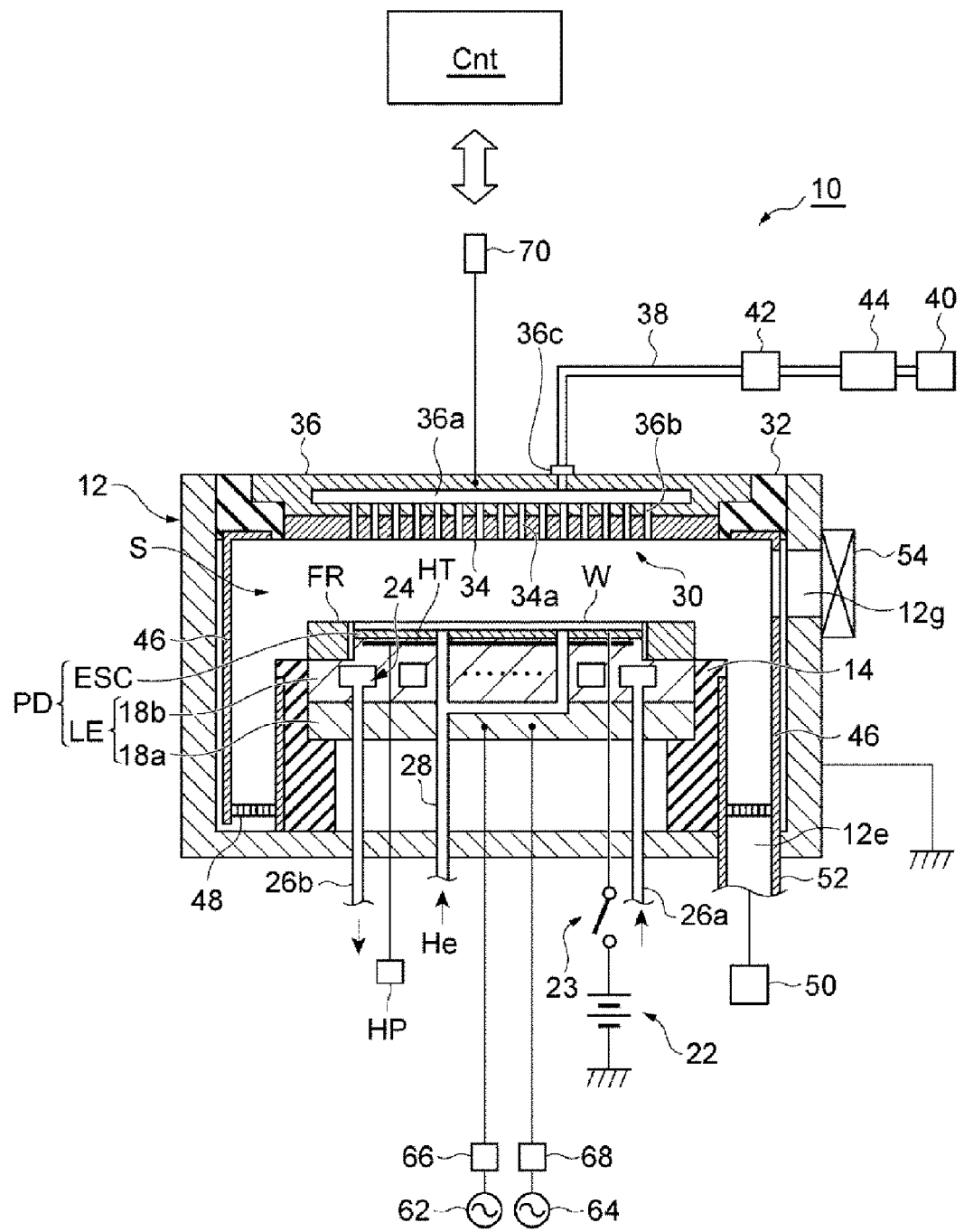
FIG. 4 is a diagram schematically illustrating an example of a plasma processing apparatus in which the method of FIG. 1 is performed.

FIG. 4 is a diagram schematically illustrating an example of a plasma processing apparatus in which the method of FIG. 1 is performed. The plasma processing apparatus 10 depicted in FIG. 4 is configured as a capacitively coupled plasma processing apparatus, and includes a substantially cylindrical processing vessel 12. The processing vessel 12 is made of, by way of non-limiting example, aluminum having an anodically oxidized inner wall surface. The processing vessel 12 is frame-grounded.

A substantially cylindrical supporting member 14 is provided on a bottom portion of the processing vessel 12. The supporting member 14 is made of, by way of example, but not limitation, an insulating material. Within the processing vessel 12, the supporting member 14 is vertically extended from the bottom portion of the processing vessel 12. Further, a mounting table PD is provided within the processing vessel 12. The mounting table PD is supported on the supporting member 14.

The mounting table PD is configured to hold the wafer W on a surface thereof. The mounting table PD includes a lower electrode LE and an electrostatic chuck ESC. The lower electrode LE includes a first plate 18a and a second plate 18b. Each of the first plate 18a and the second plate 18b is made of a metal such as, but not limited to, aluminum, and substantially has a disk shape. The second plate 18b is provided on the first plate 18a, and is electrically connected to the first plate 18a.

The electrostatic chuck ESC is provided on the second plate 18b. The electrostatic chuck ESC has a structure in which an electrode made of a conductive film is embedded between a pair of insulating layers or insulating sheets. The electrode of the electrostatic chuck ESC is electrically connected to a DC power supply 22 via a switch 23. The electrostatic chuck ESC is configured to attract and hold the wafer W by an electrostatic force such as a Coulomb force generated by a DC voltage applied from the DC power supply 22. Accordingly, the electrostatic chuck ESC is capable of holding the wafer W thereon.

A focus ring FR is disposed on a peripheral portion of the second plate 18b to surround an edge of the wafer W and the electrostatic chuck ESC. This focus ring FR is provided to improve uniformity of the plasma process performed on the wafer. The focus ring FR is made of a material which is appropriately selected depending on the plasma process involved. By way of non-limiting example, the focus ring FR may be made of quartz.

A coolant path 24 is provided within the second plate 18b. The coolant path 24 constitutes a temperature control device. A coolant is supplied into the coolant path 24 from a chiller unit provided outside the processing vessel 12 via a pipeline 26a. The coolant supplied into the coolant path 24 is returned back into the chiller unit via a pipeline 26b. With this configuration, the coolant is circulated between the coolant path 24 and the chiller unit. By controlling a temperature of the coolant, a temperature of the wafer W held on the electrostatic chuck ESC is controlled.

Further, the plasma processing apparatus 10 is equipped with a gas supply line 28. Through the gas supply line 28, a heat transfer gas, for example, a He gas, is supplied from a heat transfer gas supply device into a gap between a top surface of the electrostatic chuck ESC and a rear surface of the wafer W.

Further, the plasma processing apparatus 10 includes an upper electrode 30. The upper electrode 30 is provided above the mounting table PD. Formed between the upper electrode 30 and the mounting table PD is a processing space S in which the plasma process is performed on the wafer W.

The upper electrode 30 is supported at an upper portion of the processing vessel 12 with an insulating shield member 32 therebetween. The upper electrode 30 may include a ceiling plate 34 and a supporting body 36. The ceiling plate 34 directly faces the processing space S, and is provided with a multiple number of gas discharge holes 34a. In the exemplary embodiment, the ceiling plate 34 is formed of silicon.

The supporting body 36 is configured to support the ceiling plate 34 in a detachable manner, and is made of a conductive material such as, but not limited to, aluminum. The supporting body 36 may have a water-cooling structure. A gas diffusion space 36a is formed within the supporting body 36. Multiple gas through holes 36b are extended downwards from the gas diffusion space 36a, and these gas through holes 36b communicate with the gas discharge holes 34a, respectively. Further, the supporting body 36 is also provided with a gas inlet opening 36c through which a processing gas is introduced into the gas diffusion space 36a, and this gas inlet opening 36c is connected to a gas supply line 38.

The gas supply line 38 is connected to a gas source group 40 via a valve group 42 and a flow rate controller group 44. The gas source group 40 includes a plurality of gas sources. As an example, the gas source group 40 includes one or more sources of a fluorocarbon gas, one or more sources of a hydrofluorocarbon gas, a source of a hydrocarbon gas, a source of a rare gas, a source of a nitrogen gas ($N_2$ gas), a source of a hydrogen gas ($H_2$ gas) and one or more sources of an oxygen-containing gas. The one or more sources of the fluorocarbon gas may include, but not limited to, a source of a $C_4F_8$ gas, a source of a $CF_4$ gas, a source of a $C_4F_6$ gas, and a source of a $C_5F_8$ gas. The one or more sources of the hydrofluorocarbon gas may include, but not limited to, a source of a $CHF_3$ gas, a source of a $CH_2F_2$ gas and a source of a $CH_3F$ gas. The source of the hydrocarbon gas may be, for example, a source of a $CH_4$ gas, a $C_2H_2$ gas, a $C_2H_4$ gas, a $C_2H_6$ gas, a $C_3H_4$ gas, a $C_3H_6$ gas, a $C_3H_8$ gas, a $C_4H_4$ gas, a $C_4H_6$ gas, a $C_4H_8$ gas or a $C_4H_{10}$ gas. The source of the rare gas may be a source of a rare gas such as a He gas, a Ne gas, an Ar gas, a Kr gas or a Xe gas. Here, as an example, the source of the rare gas may be a source of an Ar gas. The one or more sources of the oxygen-containing gas may include a source of an oxygen gas ($O_2$ gas). Further, the one or more sources of the oxygen-containing gas may further include a source of a CO gas and/or a source of a $CO_2$ gas.

The valve group 42 includes a multiple number of valves, and the flow rate controller group 44 includes a multiple number of flow rate controllers such as mass flow controllers. Each of the gas sources belonging to the gas source group 40 is connected to the gas supply line 38 via each corresponding valve belonging to the valve group 42 and each corresponding flow rate controller belonging to the flow rate controller group 44.

Further, in the plasma processing apparatus 10, a deposition shield 46 is provided along an inner wall of the processing vessel 12 in a detachable manner. The deposition shield 46 is also provided on an outer side surface of the supporting member 14. The deposition shield 46 is configured to suppress an etching byproduct from adhering to a wall surface of the processing vessel 12 such as an inner wall surface thereof, and is formed by coating an aluminum member with ceramics such as $Y_2O_3$.

At the bottom side of the processing vessel 12, a gas exhaust plate 48 having a multiple number of through holes is provided between the supporting member 14 and a side wall of the processing vessel 12. The gas exhaust plate 48 may be made of, by way of example, an aluminum member coated with ceramics such as $Y_2O_3$. The processing vessel 12 is also provided with a gas exhaust opening 12e under the gas exhaust plate 48. The gas exhaust opening 12e is connected with a gas exhaust device 50 via a gas exhaust line 52. The gas exhaust device 50 includes a vacuum pump such as a turbo molecular pump, and is capable of decompressing the space within the processing vessel 12 to a required vacuum level. Further, a carry-in/out opening 12g for the wafer W is provided at the side wall of the processing vessel 12, and the carry-in/out opening 12g is opened or closed by a gate valve 54.

Furthermore, the plasma processing apparatus 10 includes a first high frequency power supply 62 and a second high frequency power supply 64. The first high frequency power supply 62 is configured to generate a first high frequency power for plasma generation having a frequency in the range from, for example, 27 MHz to 100 MHz. The first high frequency power supply 62 is connected to the lower electrode LE via a matching device 66. The matching device 66 includes a circuit configured to match an output impedance of the first high frequency power supply 62 and an impedance at a load side. Further, the first high frequency power supply 62 may be connected to the upper electrode 30 via the matching device 66.

The second high frequency power supply 64 is configured to generate a second high frequency power for bias, that is, for ion attraction into the wafer W. For example, the second high frequency power supply 64 generates the second high frequency power having a frequency in the range from 400 kHz to 13.56 MHz. The second high frequency power supply 64 is connected to the lower electrode LE via a matching device 68. The matching device 68 includes a circuit configured to match an output impedance of the second high frequency power supply 64 and an impedance at a load side.

Furthermore, the plasma processing apparatus 10 further includes a power supply 70. The power supply 70 is connected to the upper electrode 30. The power supply 70 is configured to apply, to the upper electrode 30, a voltage for attracting positive ions in the processing space S into the ceiling plate 34. As an example, the power supply 70 is a DC power supply configured to generate a negative DC voltage. As another example, the power supply 70 may be an AC power supply configured to generate an alternating current voltage having a relatively low frequency.

Further, in the exemplary embodiment, the plasma processing apparatus 10 may further include a control unit Cnt. The control unit Cnt is implemented by a computer including a processor, a storage unit, an input device, a display device, and so forth, and is configured to control individual components of the plasma processing apparatus 10. In the control unit Cnt, an operator can input commands through the input device to manage the plasma processing apparatus 10, and an operational status of the plasma processing apparatus 10 can be visually displayed on the display device. Further, the storage unit of the control unit Cnt stores therein a control program for controlling various processes performed in the plasma processing apparatus 10 by the processor, or a program for allowing each component of the plasma processing apparatus 10 to perform a process according to processing conditions, i.e., a process recipe.

Now, referring back to FIG. 1, the method MT will be elaborated. The following description will be provided for an example case where the wafer W shown in FIG. 2 is processed in the substrate processing system 110 including the plasma processing apparatus 10 shown in FIG. 4 as one of the process modules. In the following description, reference is made to FIG. 6 to FIG. 13. FIG. 6 to FIG. 13 are enlarged cross sectional views illustrating a part of the target object in the course of performing the method of FIG. 1.

First, in the method MT, the wafer W as shown in FIG. 2 is carried into the processing vessel 12 of the plasma processing apparatus 10 as the process module via the loader module 112, either one of the load lock modules 141 and 142 and the transfer module 116 from the FOUP 122. The wafer W carried into the processing vessel 12 is mounted on the mounting table PD, and is held on the mounting table PD.

Figure 5:
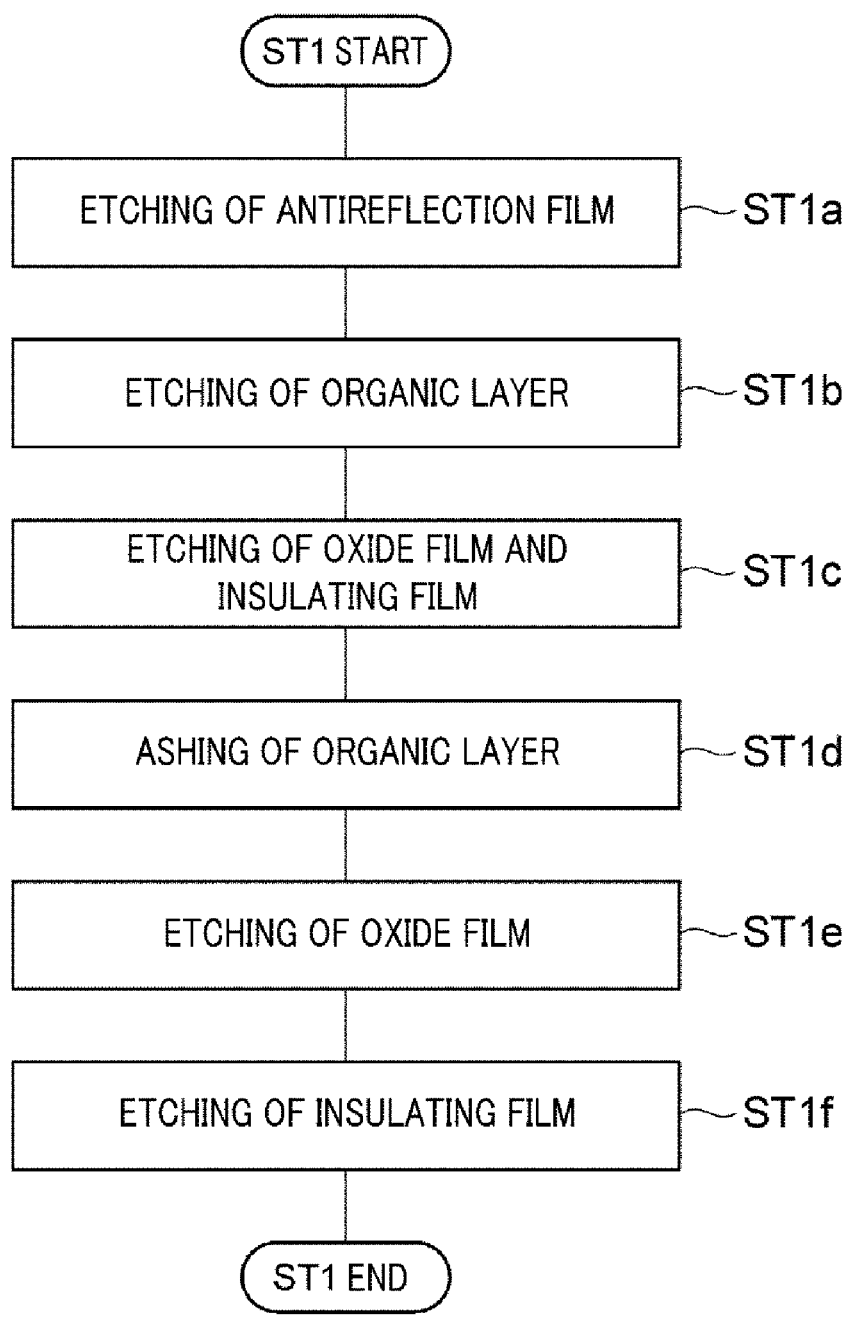
FIG. 5 is a flowchart for describing a process ST1 shown in FIG. 1.

In the method MT, a process ST1 is performed. In the process ST1, a wafer on which a subsequent process ST2 to be described layer will be performed is prepared. In the process ST1, the antireflection film AL, the organic layer OL, the oxide film OX and the second insulating film S12 are etched. Below, the process ST1 will be discussed in detail. FIG. 5 is a flowchart for describing the process ST1.

As depicted in FIG. 5, the process ST1 includes a process ST1a to a process ST1f. In the process ST1, the process ST1a is first performed. In the process ST1a, a portion of the antireflection film AL exposed through an opening MO of the resist mask RM is etched. For the purpose, in the process ST1a, a processing gas is supplied into the processing vessel 12 from a gas source selected from the gas sources belonging to the gas source group 40. This processing gas may contain, by way of example, but not limitation, a fluorocarbon gas, a hydrofluorocarbon gas and an oxygen gas. By way of non-limiting example, a $CF_4$ gas may be used as the fluorocarbon gas. Further, the hydrofluorocarbon gas may be, but not limited to, a $CHF_3$ gas. Furthermore, in the process ST1a, the gas exhaust device 50 is operated, and an internal pressure of the processing vessel 12 is regulated to a preset pressure. In addition, in the process ST1a, the first high frequency power from the first high frequency power supply 62 and the second high frequency power from the second high frequency power supply 64 are supplied to the lower electrode LE.

Figure 6:
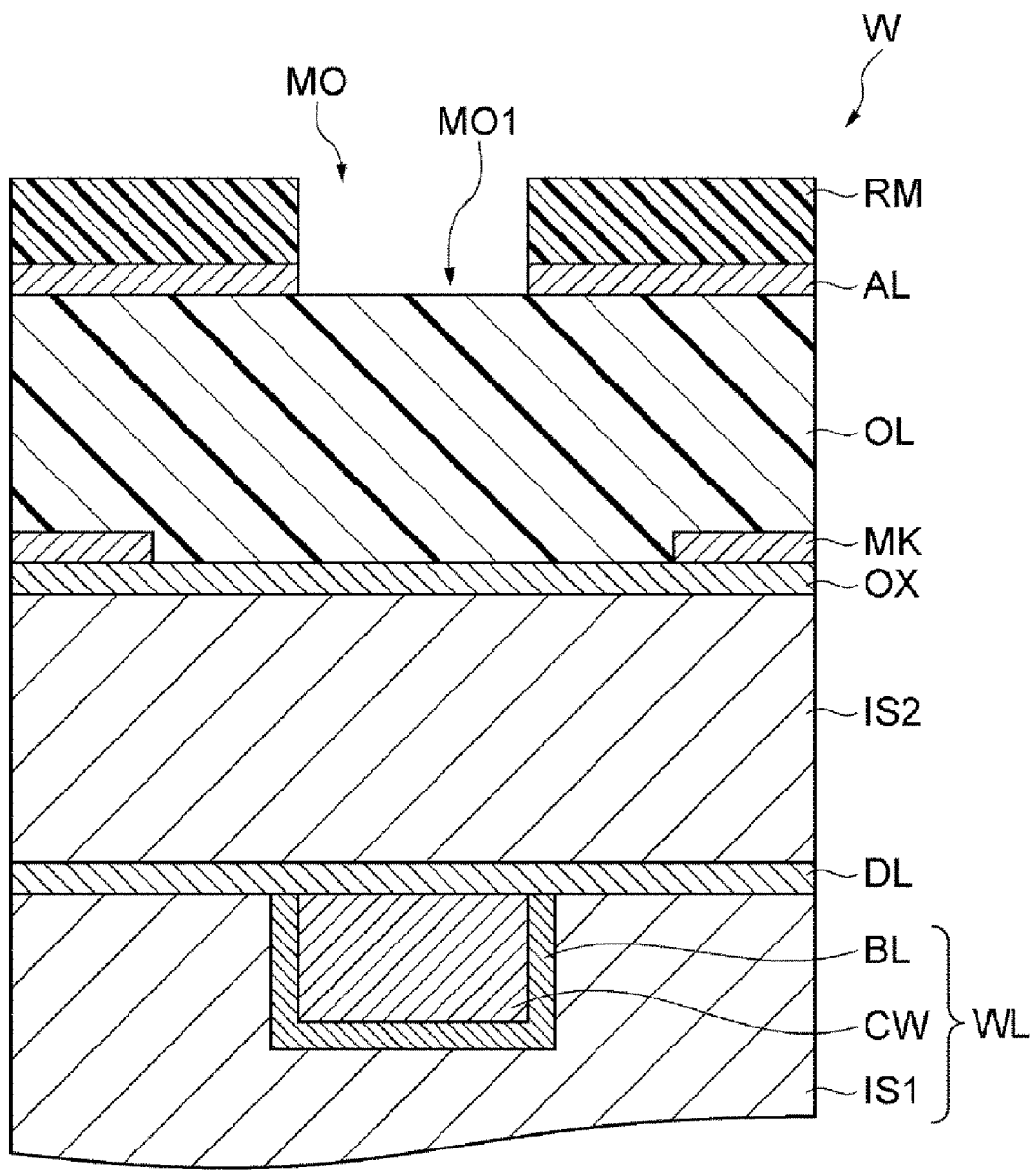
FIG. 6 is an enlarged cross sectional view illustrating a part of the target object in the course of performing the method of FIG. 1.

In the process ST1a, plasma of the processing gas is generated, and the portion of the antireflection film AL exposed through the opening MO of the resist mask RM is etched. As a result, as illustrated in FIG. 6, the portion of the antireflection film AL exposed through the opening MO of the resist mask RM is removed, so that an opening MO1 is formed in the antireflection film AL. Further, the above-described operations of the individual components of the plasma processing apparatus 10 in the process ST1a may be controlled by the control unit Cnt.

Subsequently, in the process ST1, a process ST1b is performed. In the process ST1b, the organic layer OL is etched. For the purpose, in the process ST1b, a processing gas is supplied into the processing vessel 12 from a gas source selected from the gas sources belonging to the gas source group 40. As an example of the process ST1b, a processing gas containing an oxygen gas and a carbon monoxide gas is supplied into the processing vessel 12, and, subsequently, a processing gas containing a hydrogen gas and a nitrogen gas is supplied into the processing vessel 12. Further, in the process ST1b, the gas exhaust device 50 is operated, and the internal pressure of the processing vessel 12 is regulated to a set pressure. Further, in the process ST1b, the first high frequency power is supplied to the lower electrode LE from the first high frequency power supply 62.

Figure 7:
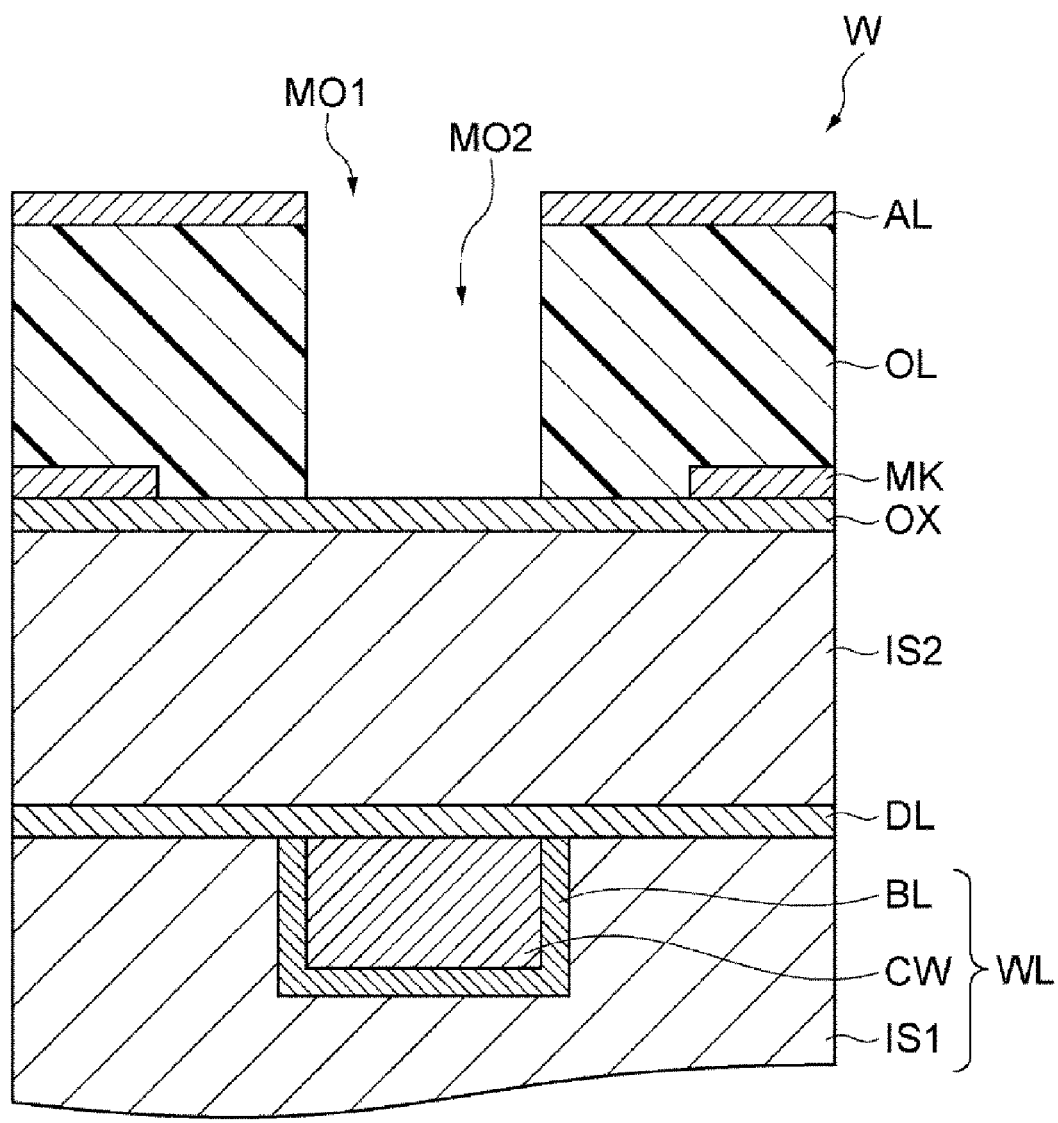
FIG. 7 is an enlarged cross sectional view illustrating a part of the target object in the course of performing the method of FIG. 1.

In the process ST1b, plasma of the processing gases is generated, and a portion of the organic layer OL exposed through the opening MO1 is etched. Further, the resist mask RM is also etched. As a result, as depicted in FIG. 7, the portion of the organic layer OL exposed through the opening MO1 is removed, so that an opening MO2 is formed in the organic layer OL. Further, the above-described operations of the individual components of the plasma processing apparatus 10 in the process ST1b may be controlled by the control unit Cnt.

Subsequently, in the process ST1, a process ST1c is performed. In the process ST1c, the oxide film OX and the second insulating film IS2 are etched. For the purpose, a processing gas is supplied into the processing vessel 12 from a gas source selected from the gas sources belonging to the gas source group 40. As an example of the process ST1c, a processing gas containing a fluorocarbon gas is supplied into the processing vessel 12, and a processing gas containing a hydrofluorocarbon gas, a nitrogen gas and an oxygen gas is then supplied into the processing vessel 12. As the fluorocarbon gas, a $CF_4$ gas and a $C_4F_8$ gas may be used, for example. Further, as the hydrofluorocarbon gas, a $CH_2F_2$ gas may be used, for example. Further, in the process ST1c, the gas exhaust device 50 is operated, and the internal pressure of the processing vessel 12 is set to a predetermined pressure. Furthermore, in the process ST1c, the first high frequency power from the first high frequency power supply 62 and the second high frequency power from the second high frequency power supply 64 are supplied to the lower electrode LE.

Figure 8:
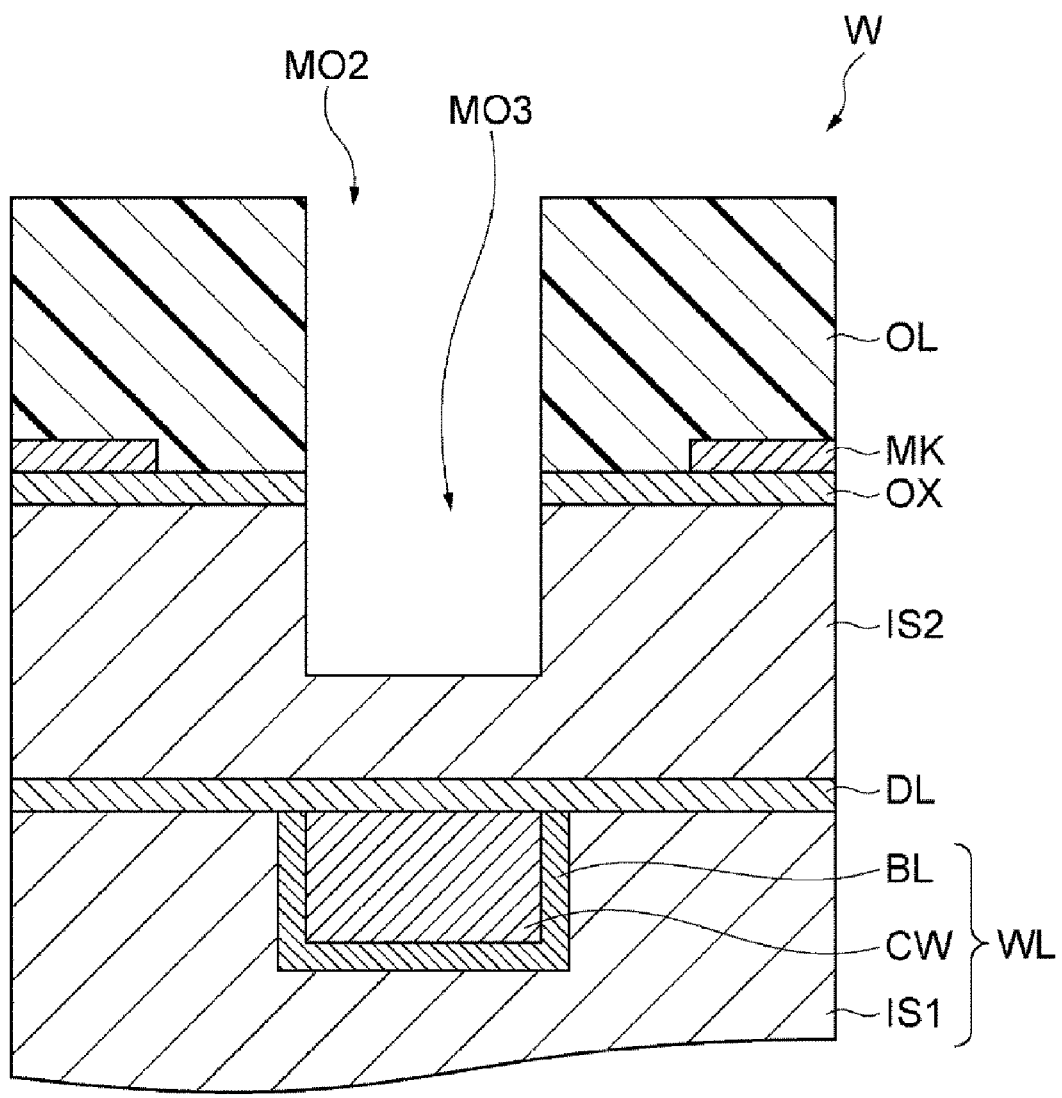
FIG. 8 is an enlarged cross sectional view illustrating a part of the target object in the course of performing the method of FIG. 1.

In the process ST1c, plasma of the processing gases is generated, and the oxide film OX and the second insulating film IS2 are etched. Here, the second insulating film IS2 is etched up to a midway portion in a film thickness direction thereof. Further, in the process ST1c, the antireflection film AL is also etched. As a result, as illustrated in FIG. 8, portions of the oxide film OX and the second insulating film IS2 exposed through the opening MO2 are removed, so that an opening MO3 is formed in the oxide film OX and the second insulating film IS2. Furthermore, in the process ST1c, the antireflection film AL is removed, and a film thickness of the organic layer OL is slightly reduced. In addition, the above-described operations of the individual components of the plasma processing apparatus 10 in the process ST1c may be controlled by the control unit Cnt.

Thereafter, in the process ST1, a process ST1d is performed. In the process ST1d, the organic layer OL is removed. For the purpose, a processing gas is supplied into the processing vessel 12 from a gas source selected from the gas sources belonging to the gas source group 40. This processing gas may contain a carbon dioxide gas. Further, in the process ST1*d*, the gas exhaust device 50 is operated, and the internal pressure of the processing vessel 12 is set to a predetermined pressure. Furthermore, in the process ST1*d*, the first high frequency power is supplied to the lower electrode LE from the first high frequency power supply 62.

Figure 9:
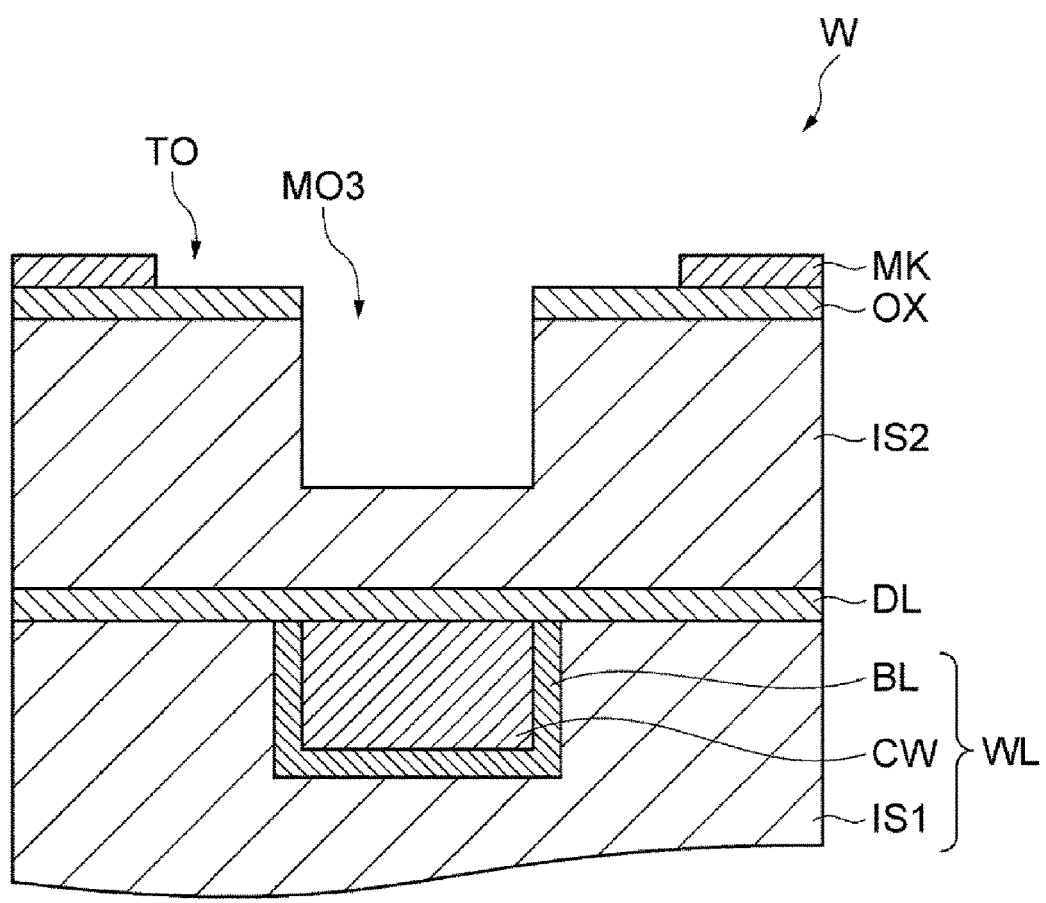
FIG. 9 is an enlarged cross sectional view illustrating a part of the target object in the course of performing the method of FIG. 1.

In the process ST1*d*, plasma of the processing gas is generated, and aching of the organic layer OL is performed. As a consequence, as depicted in FIG. 9, the organic layer OL is removed, so that a metal mask MK is exposed. The metal mask MK provided with an opening TO having a width larger than that of the opening MO3. Further, the above-described operations of the individual components of the plasma processing apparatus 10 in the process ST1*d* may be controlled by the control unit Cnt.

Subsequently, in the process ST1, a process ST1*e* is performed. In the process ST1*e*, the oxide film OX is etched. For the purpose, a processing gas is supplied into the processing vessel 12 from a gas source selected from the gas sources belonging to the gas source group 40. This processing gas may contain a fluorocarbon gas, a hydrofluorocarbon gas and a rare gas. The fluorocarbon gas may be, for example, a $CF_4$ gas. Further, the hydrofluorocarbon gas may be, by way of example, but not limitation, a $CHF_3$ gas. Further, in the process ST1*e*, the gas exhaust device 50 is operated, and the internal pressure of the processing vessel 12 is set to a predetermined pressure. In addition, in the process ST1*e*, the first high frequency power from the first high frequency power supply 62 and the second high frequency power from the second high frequency power supply 64 are supplied to the lower electrode LE.

Figure 10:
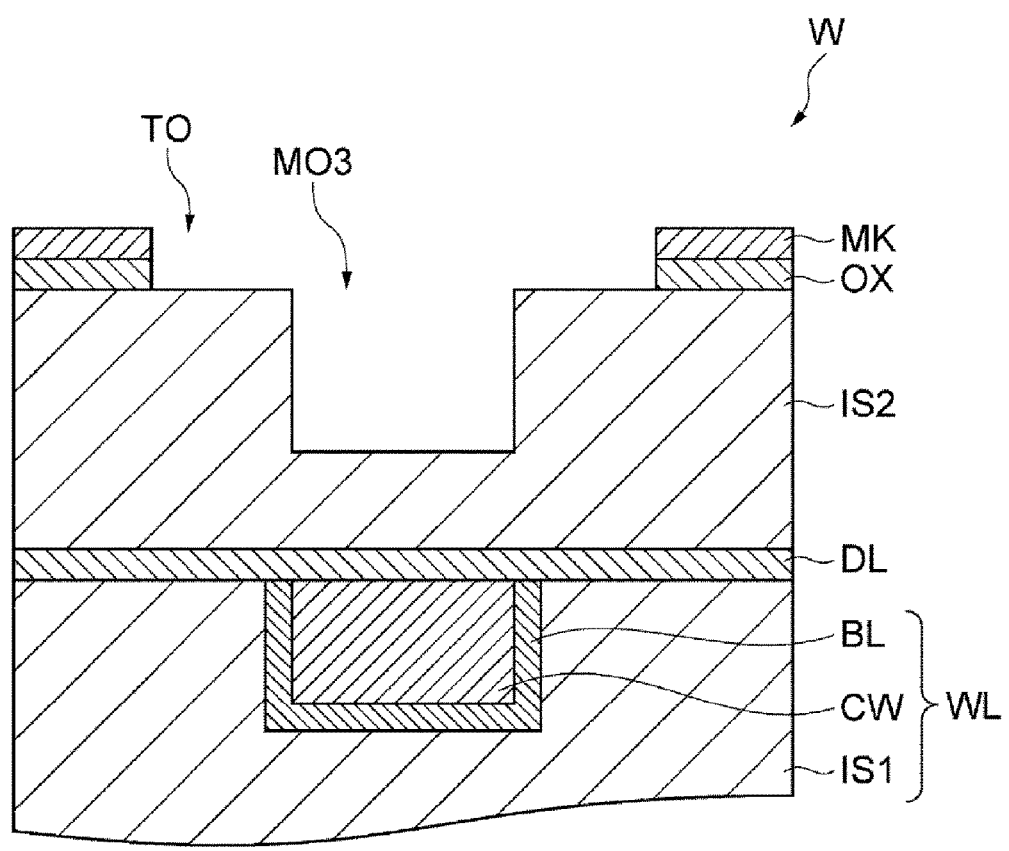
FIG. 10 is an enlarged cross sectional view illustrating a part of the target object in the course of performing the method of FIG. 1.

In the process ST1*e*, plasma of the processing gas is generated, and a portion of the oxide film OX exposed through the opening TO is etched. As a result, as depicted in FIG. 10, the portion of the oxide film OX exposed through the opening TO is removed. Further, the above-described operations of the individual components of the plasma processing apparatus 10 in the process ST1*e* may be controlled by the control unit Cnt.

Then, in the process ST1, the process ST1*f* is conducted. In the process ST1*f*, the second insulating film IS2 is further etched. For the purpose, a processing gas is supplied into the processing vessel 12 from a gas source selected from the gas sources belonging to the gas source group 40. This processing gas may contain a fluorocarbon gas, a rare gas, a nitrogen gas and an oxygen gas. The fluorocarbon gas may be, for example, a $CF_4$ gas and a $C_4F_8$ gas. Further, in the process ST1*f*, the gas exhaust device 50 is operated, and the internal pressure of the processing vessel 12 is set to a predetermined pressure. In addition, in the process ST1*f*, the first high frequency power from the first high frequency power supply 62 and the second high frequency power from the second high frequency power supply 64 are supplied to the lower electrode LE.

Figure 11:
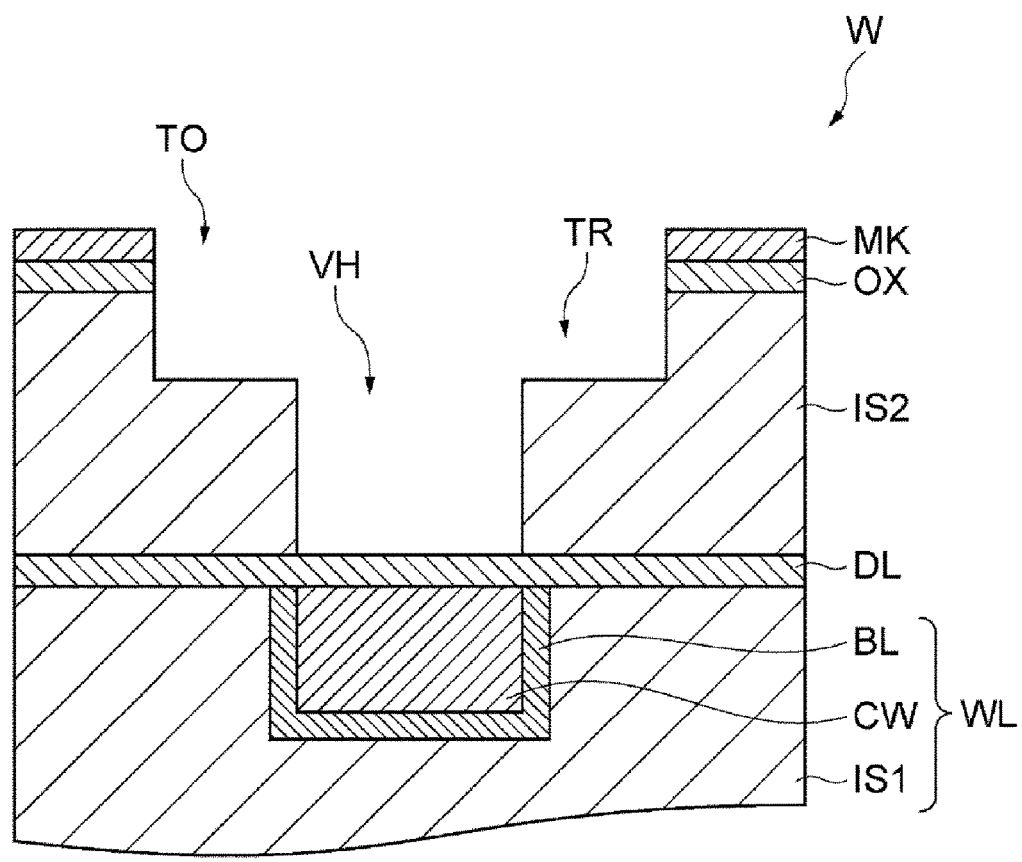
FIG. 11 is an enlarged cross sectional view illustrating a part of the target object in the course of performing the method of FIG. 1.

In the process ST1*f*, plasma of the processing gas is generated, and the second insulating film IS2 is further etched. To elaborate, a portion of the second insulating film IS2 exposed through the opening TO and a portion of the second insulating film IS2 exposed through the opening MO3 are etched. As a result, as depicted in FIG. 11, a trench TR and a via hole VH are formed in the second insulating film IS2. Furthermore, the above-described operations of the individual components of the plasma processing apparatus 10 in the process ST1*f* may be controlled by the control unit Cnt.

Referring back to FIG. 1, after the process ST1 is ended, a process ST2 is performed in the method MT. In the process ST2, plasma of a processing gas (first processing gas) containing a fluorocarbon gas and/or a hydrofluorocarbon gas is generated in order to etch the diffusion barrier film DL until the copper wiring CW is exposed. For the purpose, the processing gas is supplied into the processing vessel 12 from a gas source selected from the gas sources belonging to the gas source group 40. This processing gas may contain one or more of a $CF_4$ gas, a $CHF_3$ gas, a $C_4F_8$ gas, a $C_4F_6$ gas, a $CH_2F_2$ gas and a $CH_3F$ gas. Further, this processing gas may further contain a rare gas, a nitrogen gas and an oxygen gas. By way of example, this processing gas may contain a $CF_4$ gas, a $C_4F_8$ gas, an Ar gas, a nitrogen gas and an oxygen gas. Further, in the process ST2, the gas exhaust device 50 is operated, and the internal pressure of the processing vessel 12 is set to a predetermined pressure. Further, in the process ST2, the first high frequency power from the first high frequency power supply 62 and the second high frequency power from the second high frequency power supply 64 are supplied to the lower electrode LE.

Figure 12:
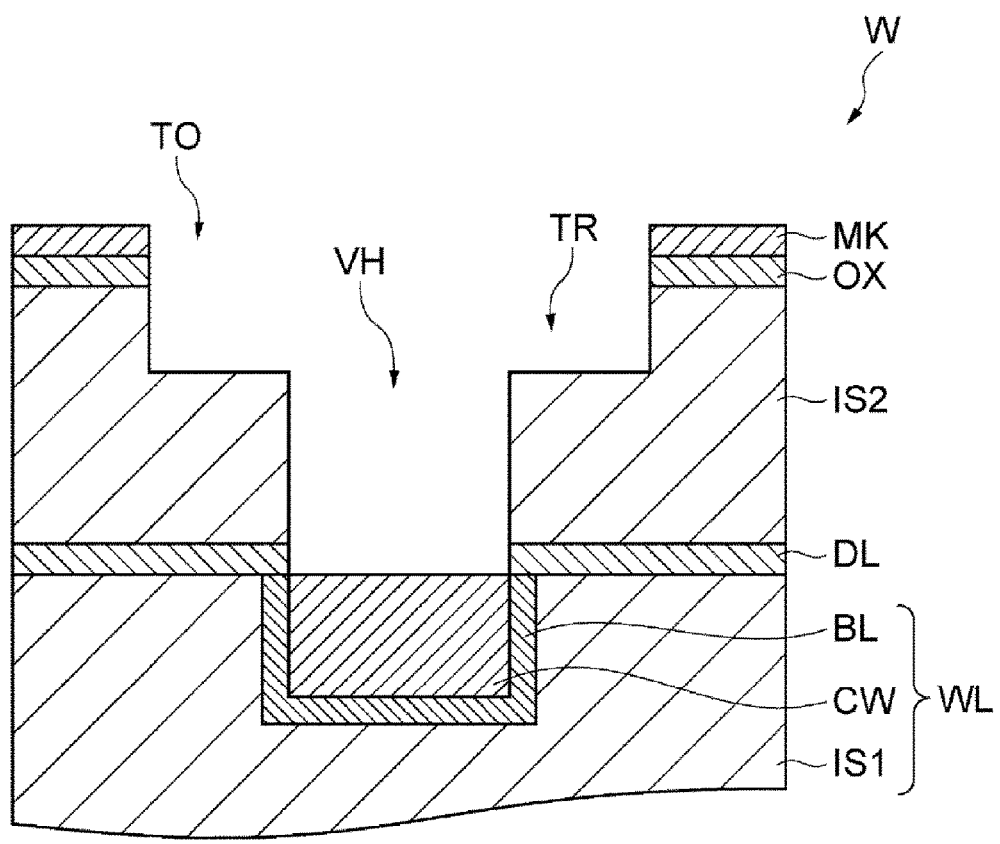
FIG. 12 is an enlarged cross sectional view illustrating a part of the target object in the course of performing the method of FIG. 1.

In the process ST2, the plasma of the processing gas is generated, and the diffusion barrier film DL is etched. As a result, as depicted in FIG. 12, the via hole VH is extended to a surface of the copper wiring CW. After the process ST2 is conducted, copper on the surface of the copper wiring CW is turned into copper fluoride. Further, a reaction product made of, by way of example, $SiF_4$ is deposited on the metal mask MK. The above-described operations of the individual components of the plasma processing apparatus 10 in the process ST2 may be controlled by the control unit Cnt.

Thereafter, in the method MT, a process ST3 is performed. In the process ST3, plasma of a processing gas (second processing gas) containing a carbon-containing gas is generated. For the purpose, the processing gas is supplied into the processing vessel 12 from a gas source selected from the gas sources belonging to the gas source group 40. Further, in the process ST3, the gas exhaust device 50 is operated, and the internal pressure of the processing vessel 12 is set to a predetermined pressure. Further, in the process ST3, the first high frequency power from the first high frequency power supply 62 and the second high frequency power from the second high frequency power supply 64 is supplied to the lower electrode LE.

Figure 13:
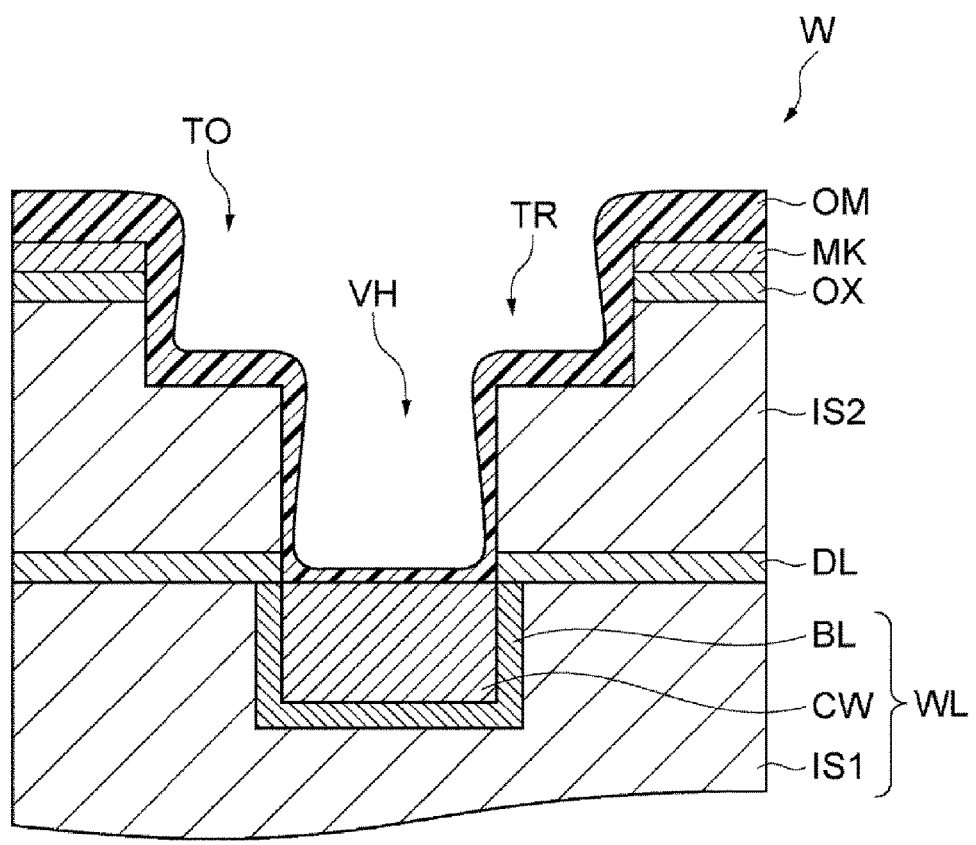
FIG. 13 is an enlarged cross sectional view illustrating a part of the target object in the course of performing the method of FIG. 1.

In the process ST3, the plasma of the processing gas is generated, and an organic film OM is formed on a surface of the wafer W, as illustrated in FIG. 13. Further, in the process ST3, the amount of the copper fluoride and the amount of the reaction product on the metal mask MK are reduced. Further, in the process ST3, the above-described operations of the individual components of the plasma processing apparatus 10 may be controlled by the control unit Cnt.

Then, a process ST4 is performed in the method MT. In the process ST4, the wafer W is carried out into the atmospheric environment. For the purpose, the wafer W is transferred by the transfer robot 116*r* within the transfer module 116 into the load lock module 141 or the load lock module 142 from the processing vessel 12. Thereafter, the wafer W is transferred into the FOUP 122 by the transfer robot 112*r* within the loader module 112.

Thereafter, a process ST5 is performed in the method MT. In the process ST5, wet cleaning is performed on the wafer W. For the purpose, the wafer W is transferred into a wet cleaning apparatus 210 (see FIG. 3). For example, an organic solvent and/or an acidic solution is used as a cleaning liquid in the process ST5. In the process ST5, the organic film OM formed on the surface of the wafer W is peeled off by the wet cleaning. Further, the aforementioned copper fluoride and/or the reaction product on the metal mask MK are removed. Immediately after the process ST5, copper is filled in the via hole VH and the trench TR.

According to the method MT, the organic film OM is formed on the surface of the wafer W in the process ST3 after the diffusion barrier film DL is etched in the process ST2. The wafer W is transferred into the atmospheric environment after the process ST3, and, at this time, the surface of the copper wiring CW and the surface of the metal mask MK are blocked by the organic film OM from the moisture in the atmosphere. Thus, according to the method MT, both the surface roughness of the copper wiring CW and the surface roughness of the metal mask MK are suppressed.

Below, the processing gas (second processing gas) used in the process ST3 will be exemplified. The processing gas of a first example that can be used in the process ST3 includes a hydrocarbon gas as the carbon-containing gas. As the hydrocarbon gas, a methane gas ($CH_4$ gas) is used, for example. Further, the processing gas of the first example may further include a rare gas. Since the processing gas of the first example contains the hydrocarbon gas as the carbon-containing gas, the organic film OM formed by the processing gas of the first example hardly contains fluorine. Accordingly, the organic film OM has a high wetting property, i.e., a small contact angle with respect to the cleaning liquid used in the wet cleaning of the process ST5. Thus, the organic film OM is easily removed by the wet cleaning.

Further, the processing gas of the first example does not contain a hydrogen gas. The hydrogen gas is a source of active species of hydrogen having an effect of reducing the organic film OM. Since the processing gas of the first example contains no hydrogen gas, the organic film OM can be formed efficiently.

The processing gas of a second example that can be used in the process ST3 contains a fluorocarbon gas as the carbon-containing gas and a hydrogen gas. As the fluorocarbon gas contained in the processing gas of the second example, one or more of a $C_4F_8$ gas, a $C_4F_6$ gas and a $C_5F_8$ gas may be used. Further, the processing gas of the second example may further include a rare gas. A film containing fluorine and carbon is formed by the fluorocarbon gas, and the amount of the fluorine in this film is reduced by active species of hydrogen generated from the hydrogen gas. Thus, by using the processing gas of the second example, the organic film OM having a small amount of fluorine is formed on the surface of the wafer W.

In the processing gas of the second example, a flow rate of the hydrogen gas may be set to be 5 times to 20 times as high as a flow rate of the fluorocarbon gas. By setting the flow rate of the hydrogen gas in this range, the organic film OM having a small amount of the fluorine can be formed.

In the exemplary embodiment, a temperature of the wafer W is maintained at 60° C. or less in a period during which the process ST3 is performed. For the purpose, a coolant having a controlled temperature is supplied into the coolant path 24 from the chiller unit provided at the outside of the processing vessel 12. Under a high-temperature environment equal to or higher than 300° C., thermal decomposition of the organic film OM may occur. By maintaining the temperature of the wafer W at 60° C. or less, however, the thermal decomposition of the organic film OM is suppressed. Thus, according to the present exemplary embodiment, the organic film OM can be formed efficiently.

Furthermore, in the exemplary embodiment, a processing condition of the process ST3, e.g., a processing time is adjusted such that a thickness of the organic film OM is equal to or larger than 2 nm. With the organic film OM having the thickness equal to or larger than 2 nm, it may be possible to suppress the moisture in the atmosphere from being contacted with the organic film OM.

In addition, in the exemplary embodiment, over a period during which the process ST2 is performed and the period during which the process ST3 is performed, the wafer W may be kept accommodated in the processing vessel 12 of the single plasma processing apparatus 10. Alternatively, the process ST2 and the process ST3 may be performed by using individual plasma processing apparatuses.

In the above, the various exemplary embodiments have been described. However, the above-described exemplary embodiments are not limiting, and various changes and modifications may be made. By way of example, to perform the process ST1 to the process ST3 of the method MT, any of various types of plasma processing apparatuses such as an inductively coupled plasma processing apparatus and a plasma processing apparatus configured to generate plasma by a surface wave such as a microwave may be used.

Hereinafter, experiments conducted to evaluate the method MT will be explained. Further, it should be noted that the present disclosure is not limited to the experiments to be described below.

[Experiment for Evaluating Method MT Including the Process ST3 with Processing Gas of First Example]

In this experiment, three wafers having the same structure as the wafer W shown in FIG. 2 are prepared. The diffusion barrier film DL of each wafer is formed of SiCN, and a film thickness thereof is 35 nm. The second insulating film IS2 is made of SiOCH, and a film thickness thereof is 150 nm. The oxide film OX is a silicon oxide film made of TEOS, and a film thickness thereof is 20 nm. The metal mask MK is made of TiN, and a film thickness thereof is 35 nm. A film thickness of the organic layer OL is 230 nm. A film thickness of the antireflection film AL is 35 nm. The resist mask RM has a film thickness of 75 nm. Further, in this experiment, samples 1 to 3 having the same structure as the wafer W shown in FIG. 11 are prepared from the three wafers by performing the process ST1 in the plasma processing apparatus 10.

Subsequently, the process ST2 is performed on the sample 1 by using the plasma processing apparatus 10. For the sample 2, the process ST2 is performed by using the plasma processing apparatus 10, and, after performing the process ST2, a plasma process is performed on the sample 2 with a nitrogen gas and a hydrogen gas. Further, the process ST2 and the process ST3 are performed on the sample 3 in the plasma processing apparatus 10. Then, the samples 1 to 3 are placed in the FOUP 122 for 24 hours. Thereafter, a surface state of the metal mask MK of each sample is observed by using an electron microscope, and a ratio (%) (hereinafter, referred to as "ratio of surface roughness of metal mask MK") of an area of a portion of the metal mask MK on which the surface roughness is generated with respect to an entire surface area of the metal mask MK is calculated.

Further, as samples 4 to 6, blanket wafers having a copper layer of a uniform thickness are prepared. For the sample 4, the process ST2 is performed by using the plasma processing apparatus 10. The process ST2 is performed on the sample 5 by using the plasma processing apparatus 10, and, after performing the process ST2, a plasma process is performed on the sample 5 with a nitrogen gas and a hydrogen gas. Further, the process ST2 and the process ST3 are performed on the sample 6 by using the plasma processing apparatus 10. Then, the samples 4 to 6 are placed in the FOUP 122 for 24 hours. Thereafter, surface states of the samples 4 to 6 are observed by using an electron microscope, and a ratio (%) (hereinafter, referred to as "ratio of surface roughness of copper layer") of an area of a portion of the copper layer of each of the samples 4 to 6 on which the surface roughness is generated with respect to an entire surface area of the copper layer is calculated.

Further, as samples 7 to 9, there are prepared blanket wafers having an insulating film which is made of SiOCH and has a uniform thickness are prepared. The process ST1*f* and the process ST2 are performed on the sample 7 by using the plasma processing apparatus 10. For the sample 8, the process ST1*f* and the process ST2 are performed by using the plasma processing apparatus 10, and, then, a plasma process is performed on the sample 8 with a nitrogen gas and a hydrogen gas. For the sample 9, the process ST1*f* and the process ST2 are performed by using the plasma processing apparatus 10, and, then, the process ST3 is further performed. Thereafter, the samples 7 to 9 are placed in the FOUP 122 for 24 hours. Afterwards, each of the samples 7 to 9 is cut into two pieces, and one of the two pieces is processed by hydrofluoric acid of 0.1% for 1 minute. Then, a difference (hereinafter, referred to as "damage amount") between a thickness of the insulating film of the one piece and a thickness of the insulating film of the other piece is calculated as a parameter for evaluating the damage on the insulating film. If the difference in the film thicknesses, that is, the damage amount is large, it may be deemed that the damage on the insulating film is large.

Further, as samples 10 to 12, silicon wafers are prepared. Only the process ST2 is performed on the sample 10 by using the plasma processing apparatus 10. For the sample 11, the process ST2 is performed by using the plasma processing apparatus 10, and, then, a plasma process is performed with a nitrogen gas and a hydrogen gas. Further, for the sample 12, the process ST2 is performed by using the plasma processing apparatus 10, and, then, the process ST3 is further performed. Then, the samples 10 to 12 are placed in the FOUP for 24 hours. Thereafter, contact angles of the samples 10 to 12 with respect to water are measured.

Below, processing conditions of individual processes in the experiment are specified.

<Process ST1*f*>

Internal pressure of processing vessel 12: 70 mTorr (9.333 Pa)

Processing gas:
 $C_4F_8$ gas: 40 sccm, $CF_4$ gas: 50 sccm, Ar gas: 1000 sccm, $N_2$ gas: 35 sccm, $O_2$ gas: 15 sccm First high frequency power: 264 W Second high frequency power: 106 W <Process ST2>

Internal pressure of processing vessel 12: 70 mTorr (9.333 Pa)

Processing gas:
 $C_4F_8$ gas: 40 sccm, $CF_4$ gas: 50 sccm, Ar gas: 1200 sccm, $N_2$ gas: 40 sccm, $O_2$ gas: 15 sccm First high frequency power: 422 W Second high frequency power: 53 W <Process ST3>

Internal pressure of processing vessel 12: 50 mTorr (6.666 Pa)

Processing gas:
 $CH_4$ gas: 20 sccm, Ar gas: 400 sccm

First high frequency power: 200 W

Second high frequency power: 0 W

<Plasma Process with Nitrogen Gas and Hydrogen Gas>

Internal pressure of processing vessel 12: 50 mTorr (6.666 Pa)

Processing gas:
 $N_2$ gas: 200 sccm, $H_2$ gas: 100 sccm

First high frequency power: 400 W

Second high frequency power: 100 W

Now, experiment results will be explained. The ratio of the surface roughness of the metal mask MK of the sample 1 is 0%. Further, the ratio of the surface roughness of the copper layer of the sample 4 is 100%. From this result, it is found out that surface roughness of the copper layer is generated if a wafer, on which the process ST2 is performed and no process is performed thereafter, is placed in the atmospheric environment.

The ratio of the surface roughness of the metal mask MK of the sample 2 is 80%. Further, the ratio of the surface roughness of the copper layer of the sample 5 is 0%. From this result, it is found out that, by performing the plasma process with the $N_2$ gas and the $H_2$ gas after performing the process ST2, the surface roughness of the metal mask MK is generated, whereas the surface roughness of the copper layer can be suppressed.

Further, the ratio of the surface roughness of the metal mask MK of the sample 3 is 0%. Further, the ratio of the surface roughness of the copper layer of the sample 6 is 0%. From this result, it is found out that the surface roughness of the copper layer and the surface roughness of the metal mask MK can both be suppressed by performing the process ST3 after performing the process ST2.

In addition, as a result of measuring the thickness of the organic film OM formed in the process ST3, the thickness is found to be 2 nm. Thus, it is found out that, if the thickness of the organic film OM is equal to or larger than 2 nm, the moisture contained in the atmosphere cannot permeate the organic film OM, so that the copper layer and the metal mask MK are protected.

Further, the damage amounts of the samples 7 to 9 are found to be 3.0 nm, 8.2 nm and 1.7 nm, respectively. From this result, it is found out that the damage on the insulating film caused by performing the process ST3 is small.

Additionally, the contact angles of the surfaces of the samples 10 to 12 with respect to the water are found to be 73.1°, 53.1° and 65.4°, respectively. Considering that the contact angle of the surface of the sample 12 with respect to the water is much smaller than 90°, it is found out that the organic film OM formed through the process ST3 has a high wetting property.

[Experiment for Evaluating Processing Conditions of Process ST3]

In this experiment, four wafers having the same structure as the wafer W shown in FIG. 2 are prepared. The diffusion barrier film DL of each wafer is formed of SiCN, and a film thickness thereof is 35 nm. The second insulating film IS2 is made of SiOCH, and a film thickness thereof is 150 nm. The oxide film OX is a silicon oxide film made of TEOS, and a film thickness thereof is 20 nm. The metal mask MK is made of TiN, and a film thickness thereof is 35 nm. A film thickness of the organic layer OL is 230 nm. A film thickness of the antireflection film AL is 35 nm. Further, the resist mask RM has a film thickness of 75 nm and has a line-and-space pattern. By performing the process ST1 in the plasma processing apparatus 10, samples 13 to 16 having the same structure as the wafer W shown in FIG. 11 are prepared from the four wafers. The process ST2 and the process ST3 are performed on each of the samples 13 to 16 by using the plasma processing apparatus 10. Then, the samples 13 to 16 are placed in the FOUP 122 for 24 hours.

Further, as samples 17 to 20, blanket wafers having a copper layer of a uniform thickness are prepared. The process ST1*f*, the process ST2 and the process ST3 are performed on each of the samples 17 to 20 by using the plasma processing apparatus 10. Then, the samples 17 to 20 are placed in the FOUP 122 for 24 hours. Further, as samples 21 to 24, there are prepared blanket wafers each having an insulating film which is made of SiOCH and has a uniform thickness, and the process ST1f, the process ST2 and the process ST3 are performed on each of the samples 21 to 24 by using the plasma processing apparatus 10. Then, the samples 21 to 24 are placed in the FOUP 122 for 24 hours.

Below, processing conditions of the process ST1f, the process ST2 and the process ST3 are specified.

<Process ST1f>
Internal pressure of processing vessel 12: 70 mTorr
Processing gas:
$C_4F_8$ gas: 40 sccm, $CF_4$ gas: 50 sccm, Ar gas: 1000 sccm, $N_2$ gas: 35 sccm, $O_2$ gas: 15 sccm
First high frequency power: 264 W
Second high frequency power: 106 W
<Process ST2>
Internal pressure of processing vessel 12: 70 mTorr (9.333 Pa)
Processing gas:
$C_4F_8$ gas: 40 sccm, $CF_4$ gas: 50 sccm, Ar gas: 1200 sccm, $N_2$ gas: 40 sccm, $O_2$ gas: 15 sccm
First high frequency power: 422 W
Second high frequency power: 53 W
<Process ST3>
Processing gas:
$CH_4$ gas: 20 sccm, Ar gas: 400 sccm Further, in the process ST3 performed on the sample 13, the sample 17 and the sample 21, the internal pressure of the processing vessel 12 is set to be 100 mTorr (13.33 Pa), and the first high frequency power and the second high frequency power are set to be 200 W and 0 W, respectively. Furthermore, in the process ST3 performed on the sample 14, the sample 18 and the sample 22, the internal pressure of the processing vessel 12 is set to be 200 mTorr (26.66 Pa), and the first high frequency power and the second high frequency power are set to be 200 W and 0 W, respectively. Furthermore, in the process ST3 performed on the sample 15, the sample 19 and the sample 23, the internal pressure of the processing vessel 12 is set to be 100 mTorr (13.33 Pa), and the first high frequency power and the second high frequency power are set to be 100 W and 0 W, respectively. In addition, in the process ST3 performed on the sample 16, the sample 20 and the sample 24, the internal pressure of the processing vessel 12 is set to be 100 mTorr (13.33 Pa), and the first high frequency power and the second high frequency power are set to be 400 W and 0 W, respectively.

The ratios of the surface roughness of the metal masks MK of the samples 13 to 16 are calculated, and it is found out that no surface roughness is generated on the metal mask MK of all of these samples. Thus, it is found out that, through the process ST3, the surface roughness of the metal mask MK can be suppressed regardless of the processing conditions involved.

Further, the ratios of the surface roughness of the copper layers of the samples 17 to 20 are calculated, and it is found out that no surface roughness is generated on the copper layers of the samples 17 to 19. As stated above, in the process ST3 performed on the samples 17 to 19, the first high frequency power is set to be equal to or less than 200 W. Meanwhile, the ratio (%) of the surface roughness of the copper layer of the sample 20 is found to be 15%, though this ratio is not high. As stated above, in the process ST3 performed on the sample 20, the first high frequency power is set to be 400 W. As can be seen from this result, in the process ST3, it is found out that it is desirable to set the first high frequency power to 200 W or less.

Furthermore, the damage amounts of the insulating films of the samples 21 to 24 are calculated. As a result, the damage amounts of the insulating films of the samples 21 to 24 are found to be 1.7 nm, 7.0 nm, 3.7 nm and 4.0 nm, respectively. As stated above, in the process ST3 performed on the sample 21, the sample 23 and the sample 24, the internal pressure of the processing vessel 12 is set to be equal to or less than 100 mTorr. Further, in the process ST3 performed on the sample 22, the internal pressure of the processing vessel 12 is set to be 200 mTorr. As a result, in the process ST3, it is found out that it is desirable to set the internal pressure of the processing vessel 12 to be equal to or less than 100 mTorr (13.33 Pa).

[Experiment for Evaluating Method MT Including Process ST3 with Processing Gas of Second Example]

In this experiment, three wafers having the same structure as the wafer W shown in FIG. 2 are prepared. The diffusion barrier film DL of each wafer is formed of SiCN, and a film thickness thereof is 35 nm. The second insulating film IS2 is made of SiOCH, and a film thickness thereof is 150 nm. The oxide film OX is a silicon oxide film made of TEOS, and a film thickness thereof is 20 nm. The metal mask MK is made of TiN, and a film thickness thereof is 35 nm. A film thickness of the organic layer OL is 230 nm. A film thickness of the antireflection film AL is 35 nm. The resist mask RM has a film thickness of 75 nm. By performing the process ST1 in the plasma processing apparatus 10, samples 25 to 27 having the same structure as the wafer W shown in FIG. 11 are prepared from the three wafers. Then, the process ST2 and the process ST3 are performed on each of the samples 25 to 27 by using the plasma processing apparatus 10. Thereafter, the samples 25 to 27 are placed in the FOUP 122 for 24 hours.

Further, as samples 28 to 30, blanket wafers having a copper layer of a uniform thickness are prepared, and the process ST1f, the process ST2 and the process ST3 are performed on each of the samples 28 to 30 by using the plasma processing apparatus 10. Thereafter, the samples 28 to 30 are placed in the FOUP 122 for 24 hours. Furthermore, as samples 31 to 33, there are prepared blanket wafers having an insulating film which is made of SiOCH and has a uniform thickness, and the process ST1f, the process ST2 and the process ST3 are performed on each of the samples 31 to 33 by using the plasma processing apparatus 10. Thereafter, the samples 31 to 33 are placed in the FOUP 122 for 24 hours. In addition, as samples 34 to 36, silicon wafers are prepared, and the process ST2 and the process ST3 are performed on each of the samples 34 to 36 by using the plasma processing apparatus 10. Thereafter, the samples 34 to 36 are placed in the FOUP 122 for 24 hours.

Below, processing conditions of the process ST1f, the process ST2 and the process ST3 are specified.

<Process ST1f>
Internal pressure of processing vessel 12: 70 mTorr
Processing gas:
$C_4F_8$ gas: 40 sccm, $CF_4$ gas: 50 sccm, Ar gas: 1000 sccm, $N_2$ gas: 35 sccm, $O_2$ gas: 15 sccm
First high frequency power: 264 W
Second high frequency power: 106 W
<Process ST2>
Processing gas:
$C_4F_8$ gas: 40 sccm, $CF_4$ gas: 50 sccm, Ar gas: 1200 sccm, $N_2$ gas: 40 sccm, $O_2$ gas: 15 sccm
First high frequency power: 422 W
Second high frequency power: 53 W <Process ST3>
Internal pressure of processing vessel 12: 50 mTorr (6.666 Pa)
First high frequency power: 200 W
Second high frequency power: 0 W In the process ST3 performed on the sample 25, the sample 28, the sample 31 and the sample 34, a flow rate of the $C_4F_8$ gas, a flow rate of the Ar gas and a flow rate of the hydrogen gas ($H_2$ gas) are set to be 20 sccm, 400 sccm and 0 sccm, respectively. Further, in the process ST3 performed on the sample 26, the sample 29, the sample 32 and the sample 35, the flow rate of the $C_4F_8$ gas, the flow rate of the Ar gas and the flow rate of the hydrogen gas are set to be 20 sccm, 400 sccm and 100 sccm, respectively. Furthermore, in the process ST3 performed on the sample 27, the sample 30, the sample 33 and the sample 36, the flow rate of the $C_4F_8$ gas, the flow rate of the Ar gas and the flow rate of the hydrogen gas are set to be 20 sccm, 400 sccm and 200 sccm, respectively.

The ratios of the surface roughness of the metal masks MK of the samples 25 to 27 are calculated, and it is found out that no surface roughness is generated on the metal mask MK of all of these samples. Thus, it is found out that the process ST3 with the processing gas containing the fluorocarbon gas is capable of suppressing the surface roughness of the metal mask MK.

Further, the ratios of the surface roughness of the metal layers of the samples 28 to 30 are calculated, and it is found out that no surface roughness is generated on the copper layers of the samples 28 to 30. Thus, it is found out that the process ST3 with the processing gas containing the fluorocarbon gas is capable of suppressing the surface roughness of the copper layer.

Furthermore, the damage amounts of the insulating films of the samples 31 to 33 are calculated. As a result, the damage amounts of the insulating films of the samples 31 to 33 are found to be 0.3 nm, 0.7 nm and 3.7 nm, respectively. From this result, it is found out that damage of the insulating film can be suppressed in the process ST3 with the processing gas containing the fluorocarbon gas.

In addition, the contact angles of the samples 34 to 36 with respect to water are calculated. As a result, the contact angles of the samples 34 to 36 with respect to the water are found to be 100.3°, 69.6° and 56.6°, respectively. From this result, by including the hydrogen gas in the processing gas used in the process ST3, it is found out that the wetting property of the organic film OM formed through the process ST3 can be improved. It is also found out that it is desirable to set the flow rate of the hydrogen gas to be 5 times to 20 times as large as the flow rate of the fluorocarbon gas.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting.

We claim:

1. A method of processing a target object, comprising:
preparing the target object, including a wiring layer having a first insulating film and a copper wiring formed in the first insulating film, a diffusion barrier film provided on the wiring layer, a second insulating film provided on the diffusion barrier film and a metal mask which is provided on the second insulating film and provided with an opening, in which a portion of the second insulating film exposed through the opening is etched;
generating plasma of a first processing gas containing a fluorocarbon gas and/or a hydrofluorocarbon gas to etch the diffusion barrier film until the copper wiring is exposed; and
generating plasma of a second processing gas containing a carbon-containing gas to form an organic film on a surface of the target object in which the diffusion barrier film is etched.

2. The method of claim 1,
wherein the carbon-containing gas is a hydrocarbon gas.

3. The method of claim 2,
wherein the second processing gas does not contain a hydrogen gas.

4. The method of claim 1,
wherein the carbon-containing gas is a fluorocarbon gas, and
the second processing gas further contains a hydrogen gas.

5. The method of claim 4
wherein a flow rate of the hydrogen gas is set to be 5 times to 20 times as large as a flow rate of the fluorocarbon gas contained in the second processing gas.

6. The method of claim 4,
wherein the second processing gas contains one or more of a $C_4F_8$ gas, a $C_4F_8$ gas and a $C_5F_8$ gas as the fluorocarbon gas contained in the second processing gas.

7. The method of claim 1,
wherein a temperature of the target object is maintained at 60° C. or less in the generating of the plasma of the second processing gas.

8. The method of claim 1,
wherein the organic film having a film thickness equal to or larger than 2 nm is formed in the generating of the plasma of the second processing gas.

9. The method of claim 1,
wherein the first processing gas contains one or more of a $CF_4$ gas, a $CHF_3$ gas, a $C_4F_8$ gas, a $C_4F_6$ gas, a $CH_2F_2$ gas and a $CH_3F$ gas.

10. The method of claim 1,
wherein the diffusion barrier film includes a single-layered film made of SiC, SiCN or SiN, or a multi-layered film including a plurality of films each of which is made of SiC, SiCN or SiN.

11. The method of claim 1,
wherein the second insulating film includes a single-layered film made of SiOCH, a multi-layered film including a film made of $SiO_2$ and a low dielectric constant film, or a multi-layered film including a plurality of low dielectric constant films.

12. The method of claim 1,
wherein the metal mask is made of Ti or TiN.

13. The method of claim 1,
wherein the target object is kept accommodated in a processing vessel of a single plasma processing apparatus over a period during which the generating of the plasma of the first processing gas is performed and a period during which the generating of the plasma of the second processing gas is performed.

* * * * *

UNITED STATES PATENT AND TRADEMARK OFFICE
CERTIFICATE OF CORRECTION

PATENT NO. : 9,780,037 B2  
APPLICATION NO. : 15/264737  
DATED : October 3, 2017  
INVENTOR(S) : Kazuya Kato et al.

Page 1 of 1

It is certified that error appears in the above-identified patent and that said Letters Patent is hereby corrected as shown below:

In the Specification

Column 11, Line 8, replace "aching" with -- ashing --.

In the Claims

Column 20, Line 29, replace "a $C_4F_8$ gas, a $C_4F_8$ gas" with -- a $C_4F_8$ gas, a $C_4F_6$ gas --.

Signed and Sealed this  
Fourteenth Day of August, 2018

Andrei Iancu  
*Director of the United States Patent and Trademark Office*